(12) United States Patent
Shindo et al.

(10) Patent No.: US 11,850,743 B2
(45) Date of Patent: Dec. 26, 2023

(54) TRANSPORT APPARATUS, SEMICONDUCTOR MANUFACTURING APPARATUS, AND TRANSPORT METHOD

(71) Applicant: TOKYO ELECTRON LIMITED, Tokyo (JP)

(72) Inventors: Takehiro Shindo, Nirasaki (JP); Toshiaki Kodama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 917 days.

(21) Appl. No.: 16/578,791

(22) Filed: Sep. 23, 2019

(65) Prior Publication Data

US 2020/0094399 A1 Mar. 26, 2020

(30) Foreign Application Priority Data

Sep. 25, 2018 (JP) .................................. 2018-179397

(51) Int. Cl.

| | | |
|---|---|---|
| *B25J 9/04* | (2006.01) | |
| *B25J 18/04* | (2006.01) | |
| *B25J 9/12* | (2006.01) | |
| *H01L 21/677* | (2006.01) | |
| *H01L 21/67* | (2006.01) | |
| *B25J 11/00* | (2006.01) | |

(Continued)

(52) U.S. Cl.
CPC .............. *B25J 9/042* (2013.01); *B25J 9/126* (2013.01); *B25J 18/04* (2013.01);
(Continued)

(58) Field of Classification Search
CPC ... B25J 9/042; B25J 9/126; B25J 18/04; B25J 9/0021; B25J 9/102; B25J 11/0095;
(Continued)

(56) References Cited

U.S. PATENT DOCUMENTS 10,155,309 B1 * 12/2018 Blank ............... H01L 21/67259
2009/0001919 A1 * 1/2009 Tsusaka ................. B25J 9/1045
700/254

(Continued)

FOREIGN PATENT DOCUMENTS

JP 61032121 A † 2/1986
JP 63101901 A † 5/1988
(Continued)

*Primary Examiner* — Nicholas Kiswanto
*Assistant Examiner* — Madison B Emmett
(74) *Attorney, Agent, or Firm* — Nath, Goldberg & Meyer; Jerald L. Meyer; Tanya E. Harkins

(57) ABSTRACT

There is provided a transport apparatus including: an articulated arm including: a first arm in which a drive motor is installed; a second arm configured to be driven by the first arm; a transmission portion configured to convert a rotation of the drive motor into a rotation of the second arm via a joint; a first detector configured to detect a first sensor value corresponding to a rotation angle of an input shaft of the transmission portion; and a second detector configured to detect a second sensor value corresponding to a rotation angle of the second arm; and a controller configured to control the articulated arm, wherein the controller is further configured to control the second arm to a target rotation angle based on the first sensor value and the second sensor value.

9 Claims, 12 Drawing Sheets

(51) Int. Cl.
*B25J 9/10* (2006.01)
*B25J 9/00* (2006.01)
*B25J 13/08* (2006.01)

(52) U.S. Cl.
CPC .. *H01L 21/67196* (2013.01); *H01L 21/67259* (2013.01); *H01L 21/67742* (2013.01); *H01L 21/67766* (2013.01); B25J 9/0021 (2013.01); B25J 9/102 (2013.01); B25J 11/0095 (2013.01); *B25J 13/088* (2013.01)

(58) Field of Classification Search
CPC .............. B25J 13/088; H01L 21/67196; H01L 21/67259; H01L 21/67742; H01L 21/67766
See application file for complete search history.

(56) References Cited

U.S. PATENT DOCUMENTS

2014/0277727 A1* 9/2014 Miu .................... G05B 19/401
  700/257
2016/0199982 A1* 7/2016 Harada .................... B25J 19/02
  901/46
2017/0087719 A1* 3/2017 Tsuchiya ............ G05B 19/4065
2018/0099422 A1* 4/2018 Yoon ........................ B25J 19/06
2019/0168389 A1* 6/2019 Shino .................... B25J 9/1694
2020/0139557 A1* 5/2020 Grädener ................ B25J 18/00

FOREIGN PATENT DOCUMENTS

| JP | S63-101901 A | | 5/1988 |
|---|---|---|---|
| JP | 06028003 A | † | 2/1994 |
| JP | H07-116975 A | | 5/1995 |
| JP | 200738360 A | | 2/2007 |
| JP | 2010269412 A | | 12/2010 |
| JP | 2011-161629 A | | 8/2011 |
| JP | 2013-013964 A | | 1/2013 |
| JP | 2016-124094 A | | 7/2016 |
| WO | 2010088251 A | † | 8/2010 |

* cited by examiner
† cited by third party

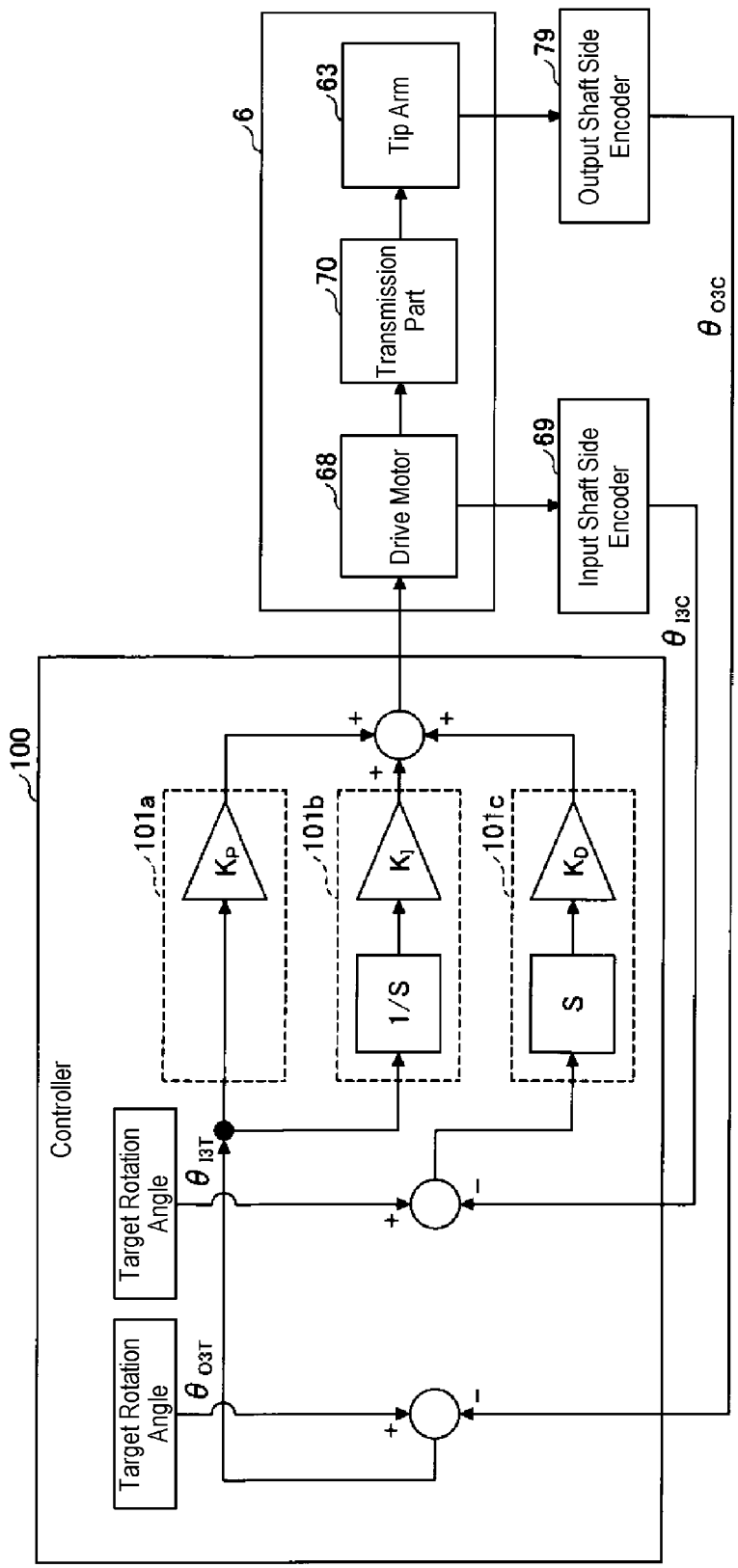

TRANSPORT APPARATUS, SEMICONDUCTOR MANUFACTURING APPARATUS, AND TRANSPORT METHOD

CROSS-REFERENCE TO RELATED APPLICATION

This application is based upon and claims the benefit of priority from Japanese Patent Application No. 2018-179397, filed on Sep. 25, 2018, the entire contents of which are incorporated herein by reference.

TECHNICAL FIELD

The present disclosure relates to a transport apparatus, a semiconductor manufacturing apparatus, and a transport method.

BACKGROUND

In recent years, with an increase in the size of an articulated-arm-robot-type transport apparatus (hereinafter, also referred to as a "transport apparatus"), as transport accuracy, the accuracy of angles of respective joints of the transport apparatus has become important. Thus, there has been proposed an articulated arm transport apparatus in which a direct drive motor is provided at each joint of the transport apparatus such that the joints individually rotate the arm (see, for example, Patent Document 1).

PRIOR ART DOCUMENT

Patent Document

Japanese Laid-Open Patent Publication No. 2007-38360

SUMMARY

According to one embodiment of the present disclosure, there is provided a transport apparatus including: an articulated arm including: a first arm in which a drive motor is installed; a second arm configured to be driven by the first arm; a transmission portion configured to convert a rotation of the drive motor into a rotation of the second arm via a joint; a first detector configured to detect a first sensor value corresponding to a rotation angle of an input shaft of the transmission portion; and a second detector configured to detect a second sensor value corresponding to a rotation angle of the second arm; and a controller configured to control the articulated arm, wherein the controller is further configured to control the second arm to a target rotation angle based on the first sensor value and the second sensor value.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a view illustrating an exemplary transport method according to a first embodiment.

DETAILED DESCRIPTION

Figure 1A:
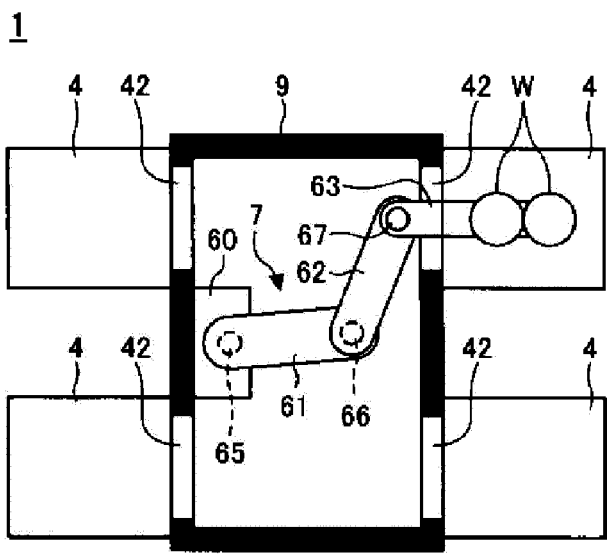
FIGS. 1A to 1C are views illustrating an exemplary configuration of a semiconductor manufacturing apparatus including a conventional transport apparatus.

Reference will now be made in detail to various embodiments, examples of which are illustrated in the accompanying drawings. In the specification and drawings, the same reference numerals are used to denote substantially the same components, and redundant descriptions will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Configuration of Conventional Transport Apparatus

Figure 1B:
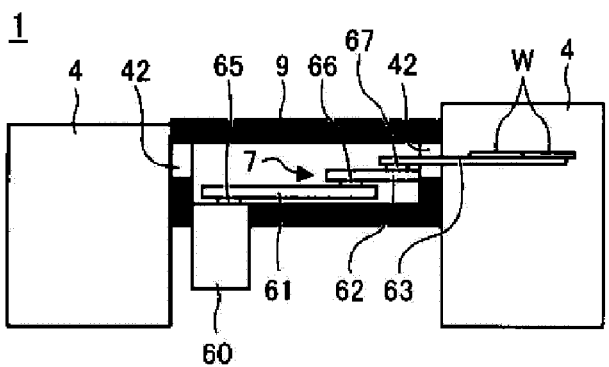
Figure 1C:
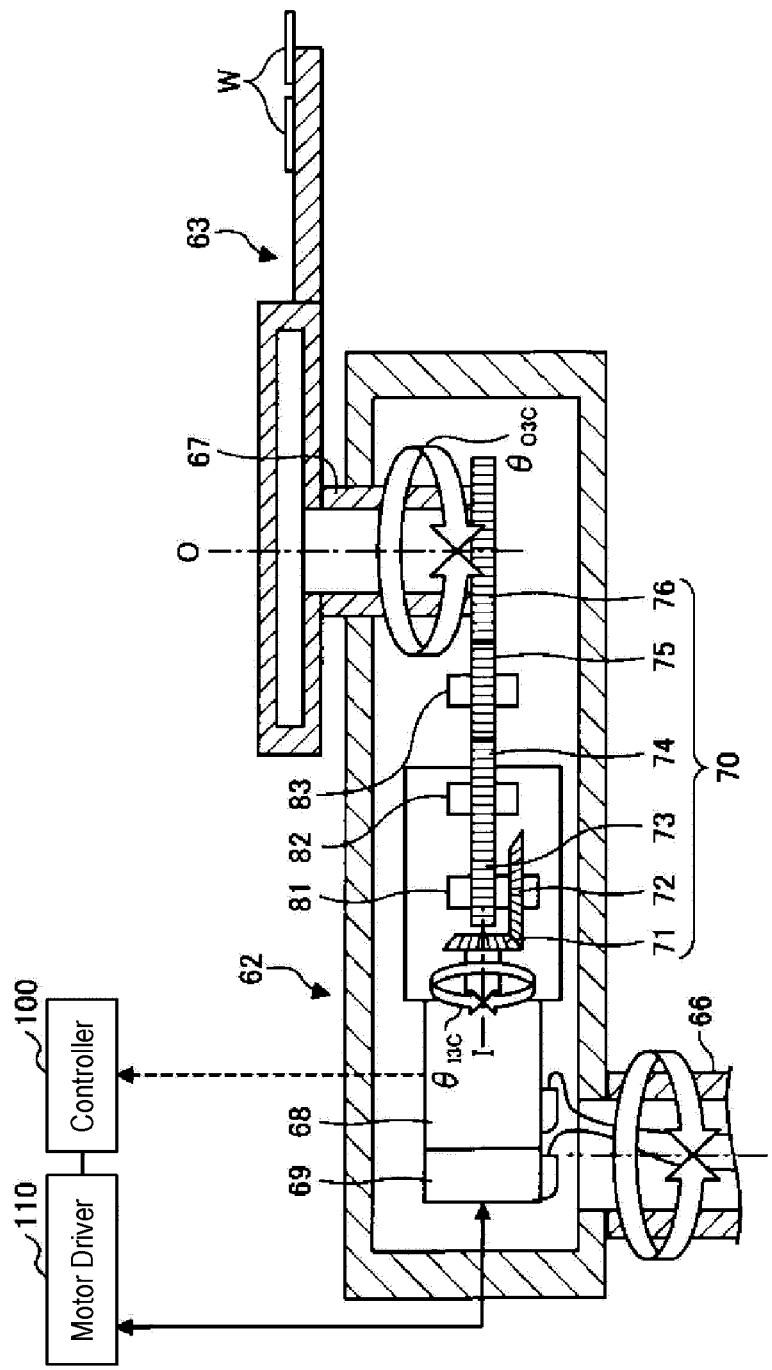

First, an exemplary configuration of a semiconductor manufacturing apparatus 1 including a conventional transport apparatus 7 will be described with reference to FIG. 1A to 1C. FIG. 1A illustrates an upper surface (plane) of a semiconductor manufacturing apparatus 1 including a conventional transport apparatus 7. FIG. 1B illustrates a side surface of the semiconductor manufacturing apparatus 1. FIG. 1C illustrates a longitudinal cross section of the tip portion of the transport apparatus 7 and the vicinity thereof.

As illustrated in FIGS. 1A and 1B, the semiconductor manufacturing apparatus 1 has a transport module 9 and four processing modules 4. Inside the transport module 9, a transport apparatus 7 having an articulated arm is installed. The transport apparatus 7 is supported by a base 60. The transport apparatus 7 loads/unloads a wafer W into/out of the processing modules 4 through a transport opening 42 using the articulated arm.

The articulated arm has a base arm 61, an intermediate arm 62 and a tip arm 63, and transports the wafer W held on the tip arm 63. A joint 65 is installed between the base 60 and the base arm 61. A joint 66 is installed between the base arm 61 and the intermediate arm 62. A joint 67 is installed between the intermediate arm 62 and the tip arm 63. The joints 65, 66, and 67 are connected to be rotatable by drive motors installed at the respective joints.

FIG. 1C illustrates a cross section of the joint 67, and the intermediate arm 62 and the tip arm 63 which are connected by the joint 67. The cross section of the base arm 61 and the intermediate arm 62 which are connected by the joint 66 and the cross section of the base 60 and the base arm 61 which are connected by the joint 65 are not illustrated. The cross section of the base arm 61 and the intermediate arm 62 which are connected by the joint 66 is substantially the same as the cross section of the intermediate arm 62 and the tip arm 63 which are connected by the joint 67 in FIG. 1C. The cross section of the base 60 and the base arm 61 which are connected by the joint 65 is different from the configurations described above, but the transport method is the same as that described above, and the overall configuration may be controlled as a system.

The intermediate arm 62 has a drive motor 68 configured to rotate the joint 67, a transmission part (transmission portion) 70, and an input shaft side encoder 69. The drive motor 68 is mounted on a shaft to which a gear 71 is fixed. The gear 71 rotates about the shaft, which is an input shaft I, by the drive motor 68. The input shaft side encoder 69 detects a rotation angle $\theta_{I3C}$ of the input shaft I. The transmission part 70 includes gears 71 to 76 and transmits the rotation of the input shaft I rotated by the drive motor 68 to an output shaft O. The gear 72 engages the gear 71 while the axis of the gear 72 is perpendicular to the axis of the gear 71. As a result, the transmission part 70 converts a horizontal axis rotation of the gear 71 by 90° into a vertical axis rotation of the gear 72.

The gear 73 rotates with the rotation of the gear 72 via a shaft 81. The rotation of the gear 73 rotates the gear 74, the gear 75, and the gear 76, which engage in this order. That is, in the transmission part 70, when the gear 71 rotates, the gear 72 and the gear 73 rotate around the shaft 81, the gear 74 and the gear 75 respectively rotate around the shafts 82 and 83, and the gear 76 at the end rotates, so that the output shaft O is driven.

Transport Method Using Conventional Transport Apparatus

Figure 2:
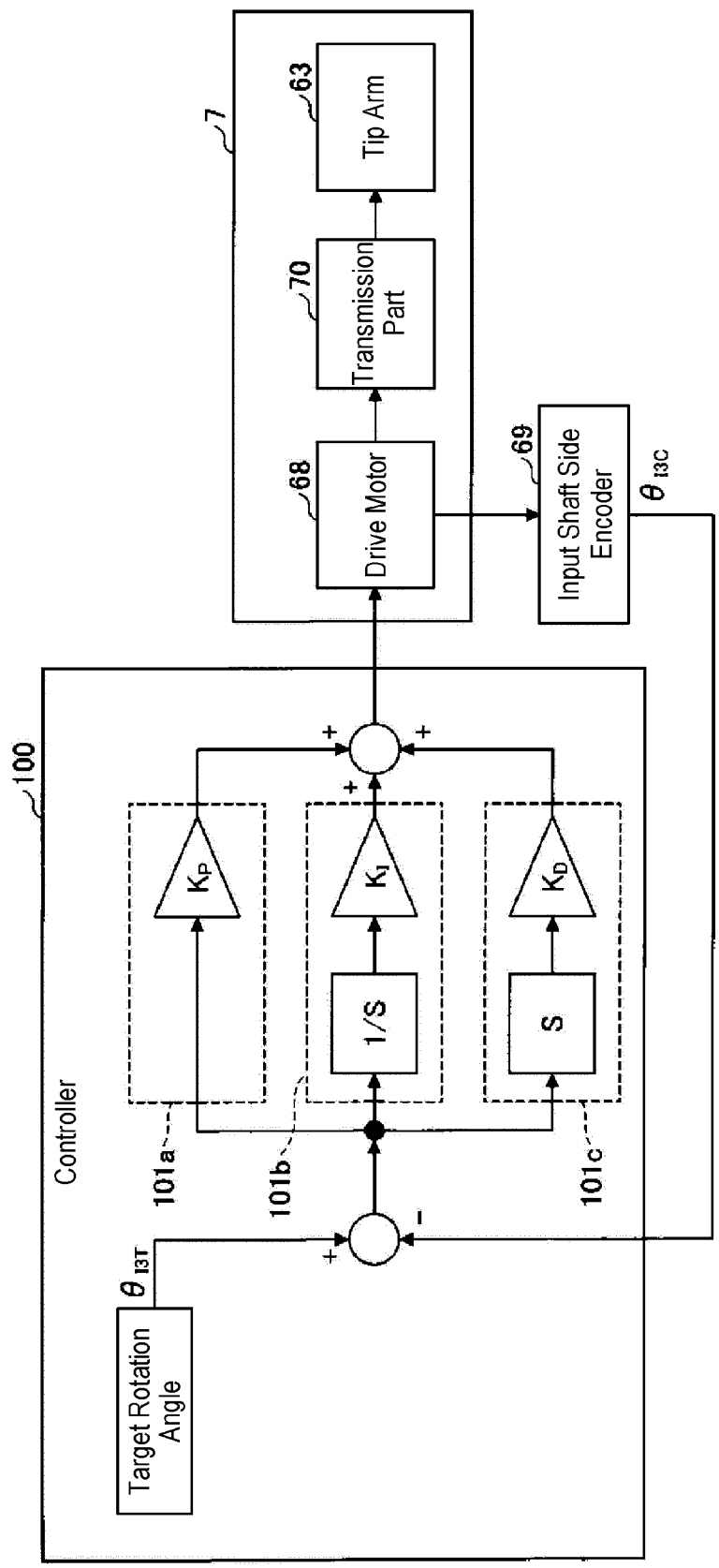
FIG. 2 is a view illustrating an exemplary conventional transport method.

Next, an exemplary conventional transport method will be described with reference to FIG. 2. When the delivery position of the wafer W, that is, the target position of the tip arm 63 is designated, a controller 100 calculates the target rotation angles of input shafts I corresponding to respective joints 65, 66, and 67 such that the tip of the tip arm 63 is positioned at the target position. The controller 100 detects the current rotation angles of the respective input shafts I corresponding to the joints 65, 66, and 67, and controls respective drive motors such that the current rotation angles become the respective target rotation angles corresponding to the joints 65, 66, and 67.

Hereinafter, a method of controlling the drive motor 68 such that the rotation angle $\theta_{I3C}$ of the input shaft I corresponding to the joint 67 becomes a target rotation angle (referred to as $\theta_{I3T}$) will be described. Since the method of controlling each of drive motors of the joints 66 and 65 such that the rotation angle of the input shaft I corresponding to each of the joints 66 and 65 becomes the target rotation angle is the same with the method of controlling the drive motor 68, the description thereof will be omitted.

The input shaft side encoder 69 detects the current rotation angle $\theta_{I3C}$ of the input shaft I rotated by the drive motor 68. The controller 100 inputs the rotation angle $\theta_{I3C}$ (see FIG. 1C). The controller 100 calculates the target rotation angle $\theta_{I3T}$ of the input shaft I such that the tip arm 63 is positioned at the target position.

The controller 100 performs a feedback-control of a control amount for controlling the drive motor 68 (a value corresponding to a motor current value) such that the detected current rotation angle $\theta_{I3C}$ becomes the target rotation angle $\theta_{I3T}$. Specifically, the controller 100 calculates a deviation e(t) between the current rotation angle $\theta_{I3C}$ and the target rotation angle $\theta_{I3T}$. Then, the controller 100 calculates the control amount for controlling the drive motor 68 via a proportional controller 101a, an integral controller 101b, and a differential controller 101c that perform a PID control, and outputs the control amount to the drive motor 68 as a command value.

In the PID control, a proportional gain $K_P$, an integral gain $K_I$, and a differential gain $K_D$, all of which are constants, are used. The proportional controller 101a calculates a control amount obtained by multiplying the deviation e(t) by the proportional gain $K_P$. The integral controller 101b calculates a control amount obtained by multiplying an integral value of the deviation e(t) from integral time 0 to t by the integral gain $K_P$. The differential controller 101c calculates a control amount obtained by multiplying the differential value of the deviation e(t) by the differential gain $K_D$. The total value obtained by summing the control amounts calculated by the proportional controller 101a, the integral controller 101b, and the differential controller 101c is transmitted as a command value to the motor driver 110, and is converted into a motor current value according to the total value by the motor driver 110. The motor current value is applied to the drive motor 68.

In the control method of the conventional transport apparatus 7 described above, due to the backlash and hysteresis of the transmission part 70, an error or a response delay occurs in the rotation angle of the output shaft O (referred to as $\theta_{O3C}$) with respect to the rotation angle $\theta_{I3C}$ of the input shaft I. As a result, the transport accuracy of the tip arm 63 may be reduced, which may cause a positional deviation that is not acceptable for transport of the wafer W. As a reason for an error component and a response delay, in addition to the backlash and the hysteresis of the transmission part 70, the slip of a belt may be mentioned when a belt and a pulley are used instead of rotation transmission gears in the transmission part 70. The above-mentioned error component, response delay, and the like lead to a decrease in transport accuracy as the hysteresis is larger or as the link length of the articulated arms is longer.

Meanwhile, it may be considered that, instead of installing the input shaft side encoder 69 on the input shaft I, an output shaft side encoder is installed on the output shaft O, and the position of the tip arm 63 is controlled using only the output shaft side encoder. However, in this case, a time delay occurs until the output shaft O rotates after the drive motor is started, which is one of the factors that deteriorate transport accuracy.

Figure 3A:
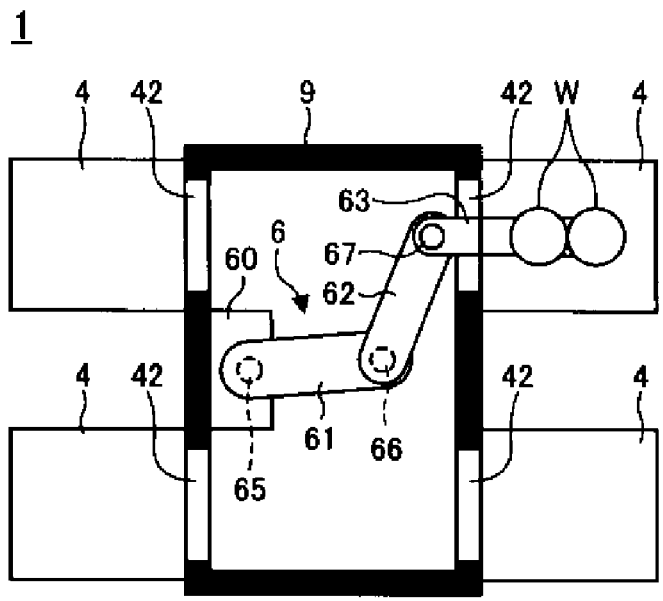
FIGS. 3A to 3C are views illustrating an exemplary configuration of a semiconductor manufacturing apparatus including a transport apparatus according to an embodiment.
Figure 3B:
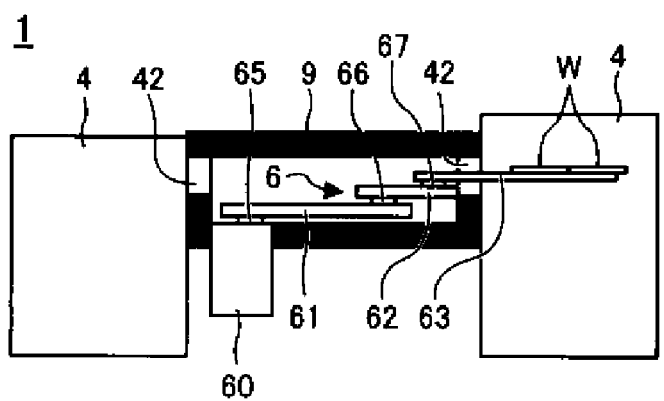
Figure 3C:
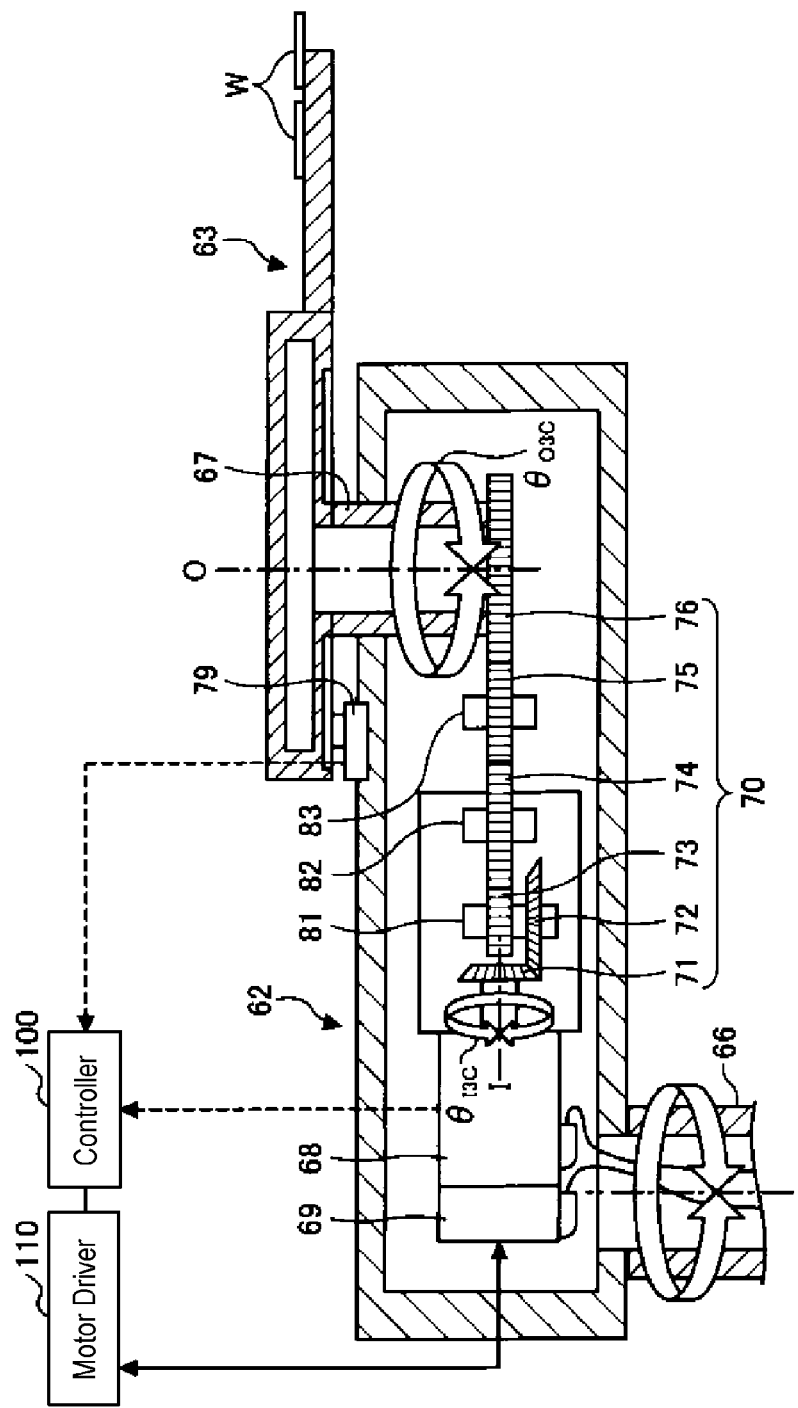

Therefore, in the transport apparatus according to the first to third embodiments described below, as illustrated in FIG. 3C, the input shaft side encoder 69 is disposed on the input shaft I side, and the output shaft side encoder 79 is disposed on the output shaft O side, whereby the PID control is appropriately performed using the two encoders. Hereinafter, the configurations of a transport apparatus and a transport method according to an embodiment will be described in order.

Configuration of Transport Apparatus

First, an exemplary configuration of a semiconductor manufacturing apparatus 1 including a transport apparatus 6 according to an embodiment will be described with reference to FIG. 3A to 3C. FIG. 3A illustrates an upper surface (plane) of the semiconductor manufacturing apparatus 1 including the transport apparatus 6 according to an embodiment. FIG. 3B illustrates a side surface of the semiconductor manufacturing apparatus 1. FIG. 3C illustrates a longitudinal cross section of the tip portion of the transport apparatus 6 and the vicinity thereof.

The transport apparatus 6 according to the present embodiment illustrated in FIGS. 3A to 3C is substantially the same as the conventional transport apparatus 7 illustrated in FIGS. 1A to 1C in configuration, except that, in the transport apparatus 6 according to the present embodiment, an output shaft side encoder 79 is mounted on the output shaft side. Accordingly, the parts having the same configuration are briefly described.

In processing modules 4 illustrated in FIGS. 3A and 3B, processes such as a film-forming process, an etching process, and an ashing process are performed on wafers W. Inside a transport module 9, a transport apparatus 6 is provided to transport the wafers W to the processing modules 4. The transport apparatus 6 has an articulated arm supported by a base 60. The articulated arm has a base arm 61, an intermediate arm 62 and a tip arm 63, which are rotatable and connected by respective joints 65, 66, and 67. The number of arms of the articulated arm is not limited to three, and may be two or more. In addition, the number of wafers W held on the tip arm 63 may be one or plural.

FIG. 3C illustrates a cross section of the joint 67, and the intermediate arm 62 and the tip arm 63 which are connected by the joint 67. The cross section of the base arm 61 and the intermediate arm 62 which are connected by the joint 66 and the cross section of the base 60 and the base arm 61 which are connected by the joint 65 are not illustrated. The cross section of the base arm 61 and the intermediate arm 62 which are connected by the joint 66 is substantially the same as the configuration of the joint 67, the intermediate arm 62, and the tip arm 63 in FIG. 3C. The cross section of the base 60 and the base arm 61 which are connected by the joint 65 is different from the configurations described above, but the transport method is the same as that described above, and the overall configuration may be controlled as a system.

In the present embodiment, it is assumed that a drive motor 68 illustrated in FIG. 3C is a motor configured to rotate the tip arm 63 via the joint 67 and that the drive motors configured to rotate the joints 65 and 66 are disposed in each of the base 60 and the base arm 61, but the present disclosure is not restricted to this configuration. For example, at least one of the plurality of joints 65, 66, and 67 included in the articulated arm may be configured to be driven by a drive motor.

The intermediate arm 62 has a drive motor 68, a transmission part 70 configured to transmit the rotation of the input shaft I to the output shaft O, and an input shaft side encoder 69. The drive motor 68 is mounted on a shaft to which a gear 71 is fixed. The drive motor 68 may be, for example, a servomotor such as a brushless DC servomotor or an AC servomotor, or may be a stepping motor. The drive motor 68 rotates the gears 71 to 76 of the transmission part 70 using the shaft as an input shaft I. As a result, the output shaft O is driven and the tip arm 63 is controlled to move to the target position. The transmission part 70 is not limited to the combination of gears, and may be a combination of belts and pulleys.

An example of the input shaft side encoder 69 may include, but is not limited to, a rotary encoder. In addition, in the present embodiment, although the input shaft side encoder 69 is mounted on the input shaft I, the present disclosure is not limited thereto, and may be mounted on a shaft 81 of the transmission part 70. That is, the rotation angle $\theta_{BC}$ detected by the input shaft side encoder 69 may be the rotation angle of the shaft 81 of the transmission part 70. In the present embodiment, the output shaft side encoder 79 is mounted at the joint 67 or the vicinity of the joint 67, which is a position where the rotational angle $\theta_{O3C}$ of the output shaft O is detectable. An example of the output shaft side encoder 79 may include, but is not limited to, a rotary encoder.

The rotation angle $\theta_{BC}$ detected by the input shaft side encoder 69 is an example of a first sensor value, and the input shaft side encoder 69 is an example of a first detector that detects the first sensor value corresponding to the rotation angle $\theta_{BC}$ of the input shaft I. The rotation angle $\theta_{O3C}$ detected by the output shaft side encoder 79 is an example of a second sensor value, and the output shaft side encoder 79 is an example of a second detector that detects the second sensor value corresponding to the rotation angle $\theta_{O3C}$ of the output shaft O.

First Embodiment

Transport Method Using Transport Apparatus

Figure 5:
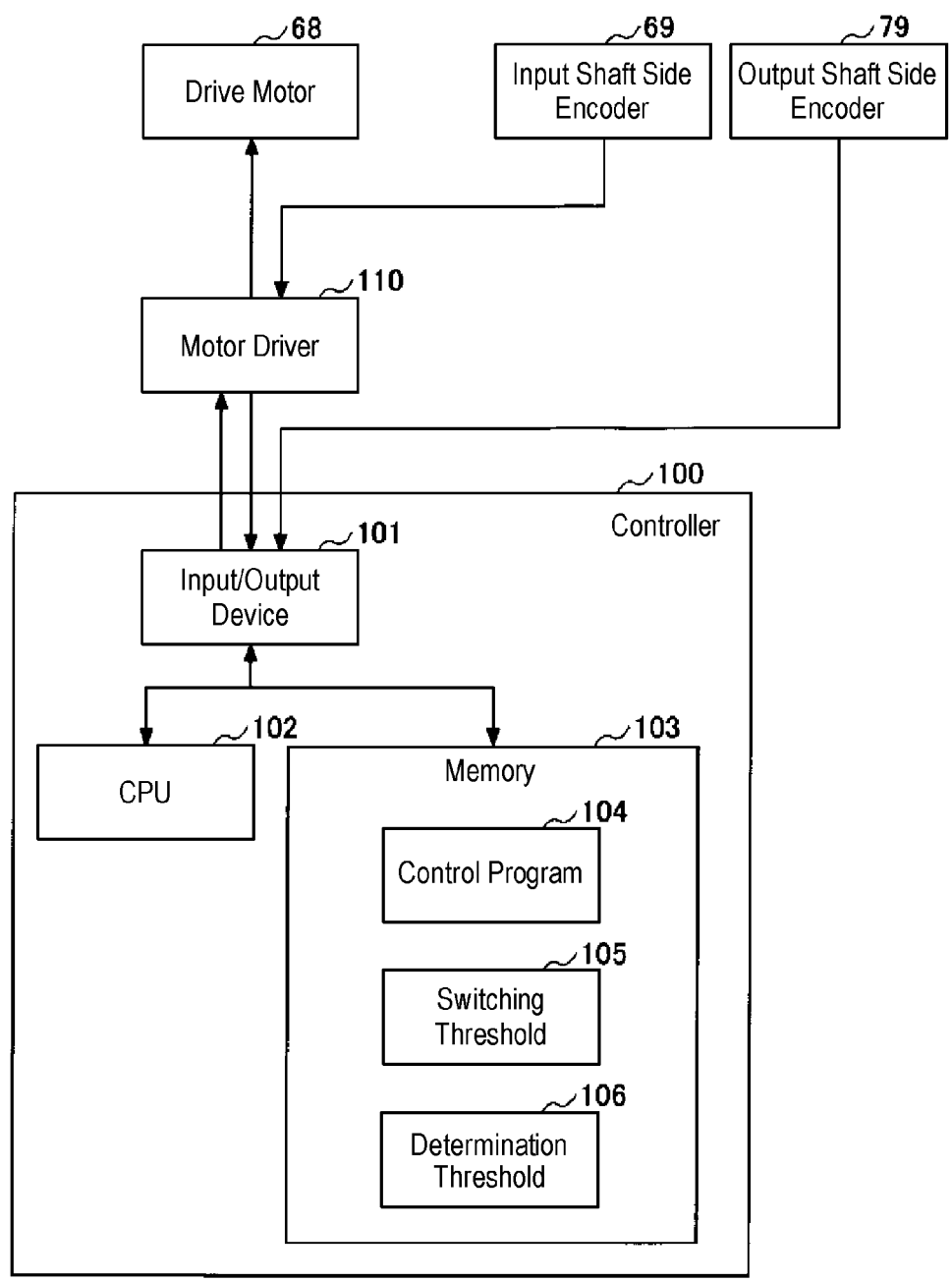
FIG. 5 is a view for explaining hardware and the operation of a controller according to an embodiment.

Next, an exemplary transport method using a transport apparatus 6 according to a first embodiment will be described with reference to FIGS. 4 and 5. FIG. 4 is a view illustrating an exemplary transport method according to a first embodiment. FIG. 5 is a view for explaining hardware and operation of a controller 100 according to an embodiment.

When the delivery position of the wafer W, that is, the target position of the tip arm 63 is designated, a controller 100 calculates target rotation angles of input shafts I corresponding to respective joints 65, 66, and 67 such that the tip of the tip arm 63 is positioned at the target position. The controller 100 detects the current rotation angles of the respective input shafts I corresponding to the joints 65, 66, and 67, and controls respective drive motors such that the current rotation angles become the respective target rotation angles corresponding to the joints 65, 66, and 67.

Specifically, based on the current rotation angle $\theta_{BC}$ detected by the input shaft side encoder 69 and the current rotation angle $\theta_{O3C}$ detected by the output shaft side encoder 79, the controller 100 performs a feedback-control of the drive motor 68 such that the tip arm 63 attains the target rotation angle. In addition, since the method of controlling each of drive motors of the joints 66 and 65 such that the rotation angles of the input shaft and the output shaft corresponding to respective joints 66 and 65 becomes the target rotation angle is the same as the feedback control of the drive motor 68, the description thereof will be omitted.

A feedback control loop illustrated in FIG. 4 is repeatedly executed, for example, at time intervals of 1 ms to 10 ms or other intervals. The input shaft side encoder 69 detects the current rotation angle $\theta_{BC}$ of the input shaft I of the transmission part 70, which is rotated by the drive motor 68. The output shaft side encoder 79 detects the current rotation angle $\theta_{O3C}$ of the tip arm 63 (the rotation angle $\theta_{O3C}$ on the output shaft O side). As illustrated in FIG. 5, the hardware configuration of the controller 100 includes an input/output device 101 and a central processing unit (CPU) 102. The controller 100 further includes memory 103 such as random access memory (RAM) or read only memory (ROM). The input/output device 101 inputs the rotation angle $\theta_{BC}$ via a motor driver 110. In addition, the input/output device 101 inputs the rotation angle $\theta_{O3C}$.

The CPU 102 determines the target rotation angle of the tip arm 63 in order to control the tip arm 63 to the target position. Then, the CPU 102 calculates the target rotation angle $\theta_{BT}$ on the input shaft I side and the target rotation angle on the output shaft O side (referred to as "$\theta_{O3T}$") such that the tip arm 63 is positioned at the determined target rotation angle in consideration of the configuration of the transmission part 70.

The memory 103 stores a control program 104 in which the procedure of the transport method according to an embodiment is set. The functions of a proportional controller 101a, an integral controller 101b, and a differential controller 101c illustrated in FIG. 4 are capable of being implemented by executing the procedure of the control program 104 by the CPU 102.

As illustrated in FIG. 4, the controller 100 includes a proportional controller 101a, an integral controller 101b, and a differential controller 101c that perform a PID control. The differential controller 101c calculates a deviation (referred to as "e1(t)") between the current rotation angle $\theta_{BC}$ detected by the input shaft side encoder 69 and the target rotation angle $\theta_{BT}$. The differential controller 101c calculates a control amount by multiplying the differential value of the deviation e1(t) by a differential gain $K_D$. The proportional controller 101a calculates a deviation (referred to as "e2(t)") between the rotation angle $\theta_{O3C}$ detected by the output shaft side encoder 79 and the target rotation angle $\theta_{O3T}$. The proportional controller 101a calculates a control amount by multiplying the deviation e2(t) by a proportional gain $K_P$. The integral controller 101b calculates a control amount by multiplying an integral value of the deviation e2(t) from integral time 0 to t by an integral gain $K_I$.

A total value obtained by summing control amounts calculated by the proportional controller 101a, the integral controller 101b, and the differential controller 101c is transmitted as a command value from the input/output device 101 to the motor driver 110, as illustrated in FIG. 5. Then, the total value is converted into a motor current value corresponding to the total value by the motor driver 110, and is provided to the drive motor 68.

It is possible to enhance the transport accuracy of the tip arm 63 through the above-described transport method. That is, the time delay until the rotation of the input shaft I is transmitted to the output shaft O affects the control of the rotational speed of the input shaft I of the drive motor 68 due to the occurrence of backlash or hysteresis, and becomes a factor causing hunting on the output shaft O. Therefore, the control of the rotational speed of the tip arm 63 is required to be quick. Accordingly, the differential controller 101c uses the rotation angle $\theta_{BC}$ of the input shaft I capable of rapidly controlling the rotation speed of the tip arm 63. Then, the differential controller 101c calculates the control amount of the rotation speed by multiplying the differential value of the deviation e1(t) between the rotation angle $\theta_{BC}$ and the target rotation angle $\theta_{BT}$ by the differential gain $K_D$.

On the other hand, when the rotation angle $\theta_{BC}$ of the input shaft I detected by the input shaft side encoder 69 is used for the position control of the tip arm 63, the accuracy of position control of the tip arm 63 may be deteriorated due to backlash or hysteresis of the transmission part 70. Therefore, the proportional controller 101a and the integral controller 101b use the rotation angle $\theta_{O3C}$ of the output shaft O that does not include the error component of the rotation and the response delay caused by the structure of the transmission part 70. The proportional controller 101a calculates the positional control amount by multiplying the deviation e2(t) between the rotation angle $\theta_{O3C}$ and the target rotation angle $\theta_{O3T}$ by the differential gain $K_D$. The integral controller 101b calculates a control amount of a positional integral value by multiplying an integral value of the deviation e2(t) from integral time 0 to t by an integral gain $K_I$. Then, the controller 100 is capable of enhancing the transport accuracy while suppressing the occurrence of hunting by controlling the drive motor 68 based on the total value of the control amounts respectively calculated by the proportional controller 101a, the differential controller 101c, and the integral controller 101b.

In the foregoing description, an operation example in which the intermediate arm 62 is set to be a first arm and the tip arm 63 is set to be a second arm driven by the first arm has been described. In this case, the input shaft side encoder 69 is an example of a first detector that detects a first sensor value corresponding to the rotation angle of the input shaft of the transmission part 70 provided in the intermediate arm 62. The output shaft side encoder 79 is an example of a second detector that detects a second sensor value corresponding to the rotation angle of the tip arm 63.

Even when the base arm 61 is set to be the first arm and the intermediate arm 62 is set to be the second arm driven by the first arm, a control may be performed in the same manner as described above. In this case, the first detector detects the first sensor value corresponding to the rotation angle of the input shaft of the transmission part (transmission portion) provided in the first arm, and the second detector detects the second sensor value corresponding to the rotation angle of the second arm. Then, the controller 100 controls the second arm to the target rotation angle based on the first sensor value and the second sensor value.

In this case, the tip arm 63 may be considered as an example of a third arm that is driven by the second arm, and an additional transmission part (additional transmission portion) provided in the second arm converts the rotation of the drive motor provided in the second arm into the rotation of the third arm through a joint. A third detector installed in the second arm detects a third sensor value corresponding to the rotation angle of an input shaft of the additional transmission part of the second arm, and a fourth detector installed in the third arm detects a fourth sensor value corresponding to the rotation angle of the third arm. Then, the controller 100 controls the third arm to a target rotation angle based on the third sensor value and the fourth sensor value.

Second Embodiment

Transport Method Using Transport Apparatus

Figure 6:
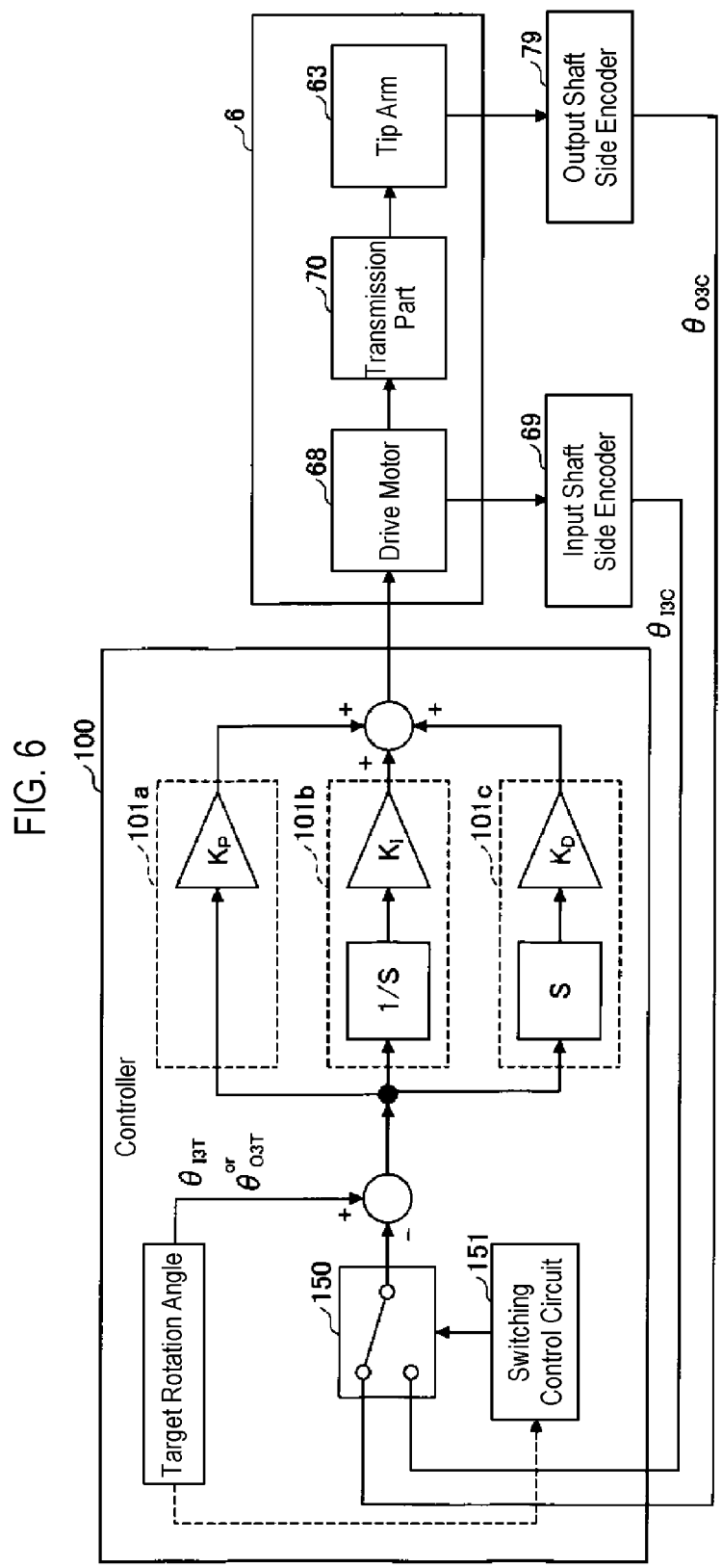
FIG. 6 is a view illustrating an exemplary transport method according to a second embodiment.

Next, an exemplary transport method according to a second embodiment will be described with reference to FIG. 6.

The controller 100 according to the second embodiment is different from the controller 100 according to the first embodiment in that the controller 100 according to the second embodiment includes a switching control circuit 151 and a switching switch 150 in addition to the controller 100 according to the first embodiment. In the transport method according to the second embodiment, the controller 100 switches and uses the rotation angle $\theta_{BC}$ of the input shaft I detected by the input shaft side encoder 69 and the rotation angle $\theta_{O3C}$ of the output shaft O detected by the output shaft side encoder 79 to control the tip arm 63 to the target rotation angle.

Hereinafter, the switching control circuit 151 and the switching switch 150 will be described as an example of a switching part included in the controller 100. The function of the switching part is not limited to the switching control circuit 151 and the switching switch 150, and may be implemented by executing a program for implementing the operations of the switching control circuit 151 and the switching switch 150 by the CPU 102.

In the present embodiment, the switching control circuit 151 switches an input sensor value between the rotation angle $\theta_{I3C}$ of the input shaft I and the rotation angle $\theta_{O3C}$ of the output shaft O based on a switching threshold 105. The switching threshold 105 is stored in the memory 103 (see FIG. 5), and set in advance to a value serving as an index for determining whether the tip arm 63 has approached the target position.

When the delivery position of the wafer W, i.e. the target position of the tip arm 63 is designated, the controller 100 calculates the target rotation angle $\theta_{I3T}$ of the input shaft I and the target rotation angle $\theta_{O3T}$ of the output shaft O such that the tip arm 63 is positioned at the target position.

When a feedback control according to the present embodiment is started, the proportional controller 101a calculates a deviation e1(t) between the rotation angle $\theta_{I3C}$ and the target rotation angle $\theta_{I3T}$ of the input shaft I. The proportional controller 101a calculates a control amount by multiplying the deviation e1(t) by a proportional gain $K_P$. The integral controller 101b calculates a control amount by multiplying an integral value of the deviation e1(t) from integral time 0 to t by an integral gain $K_I$. The differential controller 101c calculates a control amount by multiplying the differential value of the deviation e1(t) by a differential gain $K_D$.

The total value obtained by summing the control amounts respectively calculated by the proportional controller 101a, the integral controller 101b, and the differential controller 101c is provided as a command value to the motor driver 110 (see FIG. 5), and a motor current value corresponding to the command value is applied to the drive motor 68.

The above control is repeated, and when it is determined that the differential value (hereinafter, also referred to as "command speed") of the deviation e1(t) calculated by the differential controller 101c approaches 0 and becomes equal to or less than the switching threshold 105, the controller 100 switches the input sensor value from the rotation angle $\theta_{I3C}$ to the rotation angle $\theta_{O3C}$ detected by the output shaft side encoder 79.

Figure 7:
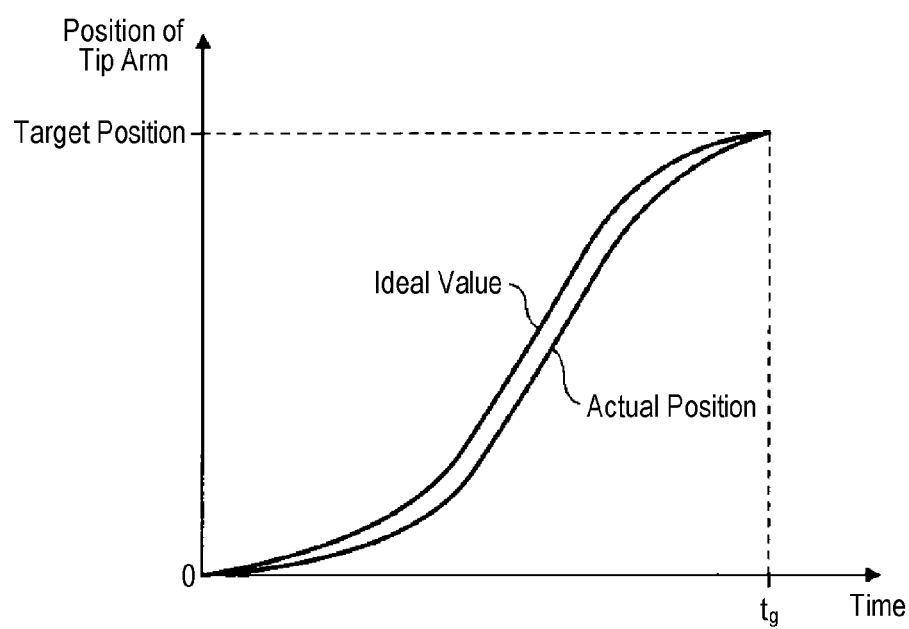
FIG. 7 is a view for explaining transport accuracy.

An example of switching control by the switching control circuit 151 will be described with reference to FIGS. 7 and 8. FIG. 7 is a diagram for explaining the transfer accuracy, the horizontal axis indicates time, and the vertical axis indicates the position of the tip arm 63. Time $t_g$ in FIG. 7 is the time at which the tip arm 63 has reached the target position. When the drive motor 68 is driven based on the command value to control the position of the tip arm 63 to be an ideal value represented in FIG. 7 in a conventional transport method, the actual position of the tip arm 63 is controlled toward the target position in the state of being delayed from the position to be controlled (ideal value) due to the influence of backlash and hysteresis.

Figure 8:
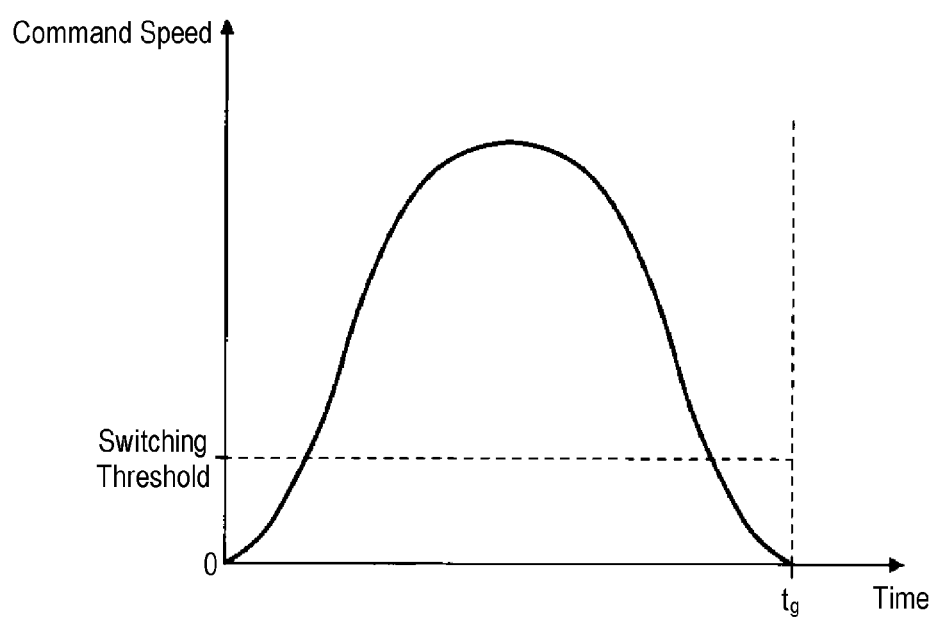
FIG. 8 is a view for explaining a transport method according to the second embodiment.

Therefore, in the present embodiment, when it is determined that, after the command speed exceeds the peak, the command speed represented on the vertical axis in FIG. 8 becomes 0 or approaches 0, it is determined that the tip arm 63 has approached the target position, and the input sensor value is switched from the rotation angle $\theta_{I3C}$ of the input shaft I to the rotation angle $\theta_{O3C}$ of the output shaft O. The command speed represented on the vertical axis of FIG. 8 indicates the differential value of the deviation e1(t) between the rotation angle $\theta_{I3C}$ and the target rotation angle $\theta_{I3T}$ of the input shaft I, and time $t_g$ represented on the horizontal axis is the time at which the tip arm 63 has reached the target position. That is, as represented in FIG. 8, the switching threshold is a value used to determine that the tip arm 63 has approached the target position. Then, when the command speed becomes equal to or less than the switching threshold after exceeding the peak, the switching control circuit 151 switches the switching switch 150, and inputs the rotation angle $\theta_{O3C}$ detected by the output shaft side encoder 79.

After switching, the proportional controller 101a calculates the deviation e2(t) between the current rotation angle $\theta_{O3C}$ and the target rotation angle $\theta_{O3T}$ of the output axis O. The proportional controller 101a calculates a control amount by multiplying the deviation e2(t) by a proportional gain $K_P$. The integral controller 101b calculates a control amount by multiplying an integral value of the deviation e2(t) from integral time 0 to t by an integral gain $K_I$. The differential controller 101c calculates a control amount by multiplying the differential value of the deviation e2(t) by a differential gain $K_D$.

The total value obtained by summing the control amounts calculated by the proportional controller 101a, the integral controller 101b, and the differential controller 101c is transmitted as a command value to the motor driver 110, and is converted into a motor current value corresponding to the command value. The motor current value is provided to the drive motor 68.

As described above, according to the transport method of the second embodiment, the rotation angle $\theta_{I3C}$ of the input shaft I is input until the tip arm 63 approaches the target position, and a feedback control is performed such that the rotation angle $\theta_{I3C}$ approaches the target rotation angle $\theta_{I3C}$. Thereby, it is possible to cause the tip arm 63 to quickly approach the target position.

Meanwhile, when it is determined that the tip arm 63 has approached the target position using the switching threshold 105, the input sensor value is switched to the rotation angle $\theta_{O3C}$ of the output shaft O. As a result, when the tip arm 63 has approached the target position, a feedback control is performed such that the rotation angle $\theta_{O3C}$ approaches the target rotation angle $\theta_{O3T}$ using the rotation angle $\theta_{O3C}$ of the output shaft O that does not include the error component of the rotation and response delay caused by the structure of the transmission part 70. In this way, it is possible to enhance the accuracy of transport while preventing the reduction of the transport speed by switching the sensor value used to enable a position control more accurately from the rotation angle $\theta_{I3C}$ of the input shaft I to the rotation angle $\theta_{O3C}$ of the output shaft O when the tip arm 63 approaches the target position.

Although the timing of switching between the rotation angle $\theta_{I3C}$ of the input shaft I and the rotation angle $\theta_{O3C}$ of the output shaft O is determined using the switching threshold 105 in this embodiment, the present disclosure is not limited thereto and a preset time may be used as the switching threshold 105. For example, the switching part may switch the input sensor value from the rotation angle $\theta_{I3C}$ of the input shaft I to the rotation angle $\theta_{O3C}$ of the output shaft O when the time set as the switching threshold 105 elapses after the feedback control is started.

When it is determined that the rotation angle $\theta_{I3C}$ has approached the target rotation angle $\theta_{I3T}$, the input sensor value may be switched from the rotation angle $\theta_{I3C}$ of the input shaft I to the rotation angle $\theta_{O3C}$ of the output shaft O. In this case, the fact that the rotation angle $\theta_{I3C}$ approaches the target rotation angle $\theta_{I3T}$ includes, for example, the case in which the rotation angle $\theta_{I3C}$ becomes substantially equal to the target rotation angle $\theta_{I3T}$.

Third Embodiment

Method of Replacing Transmission Part

Figure 9:
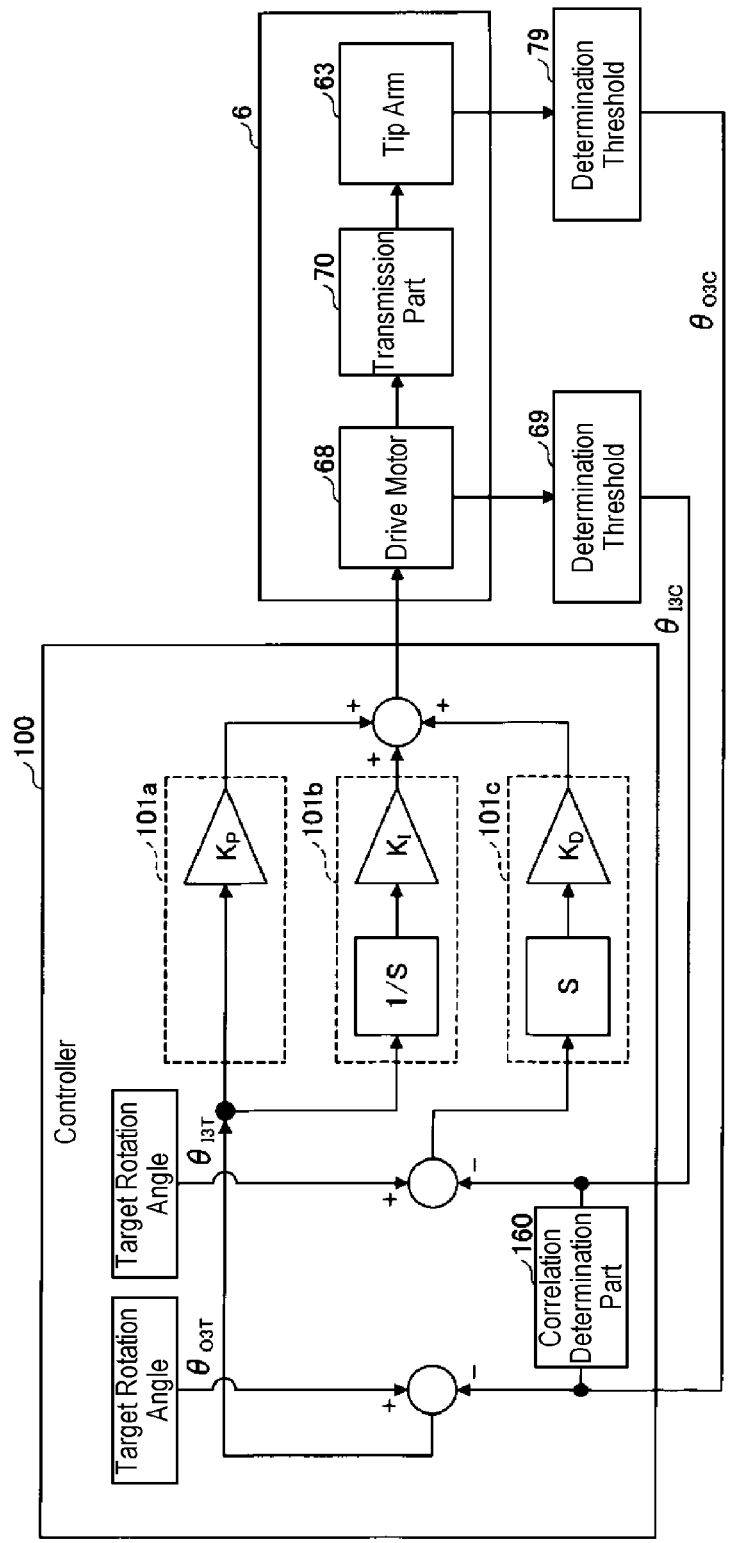
FIG. 9 is a view illustrating an exemplary transport method according to a third embodiment.
Figure 10:
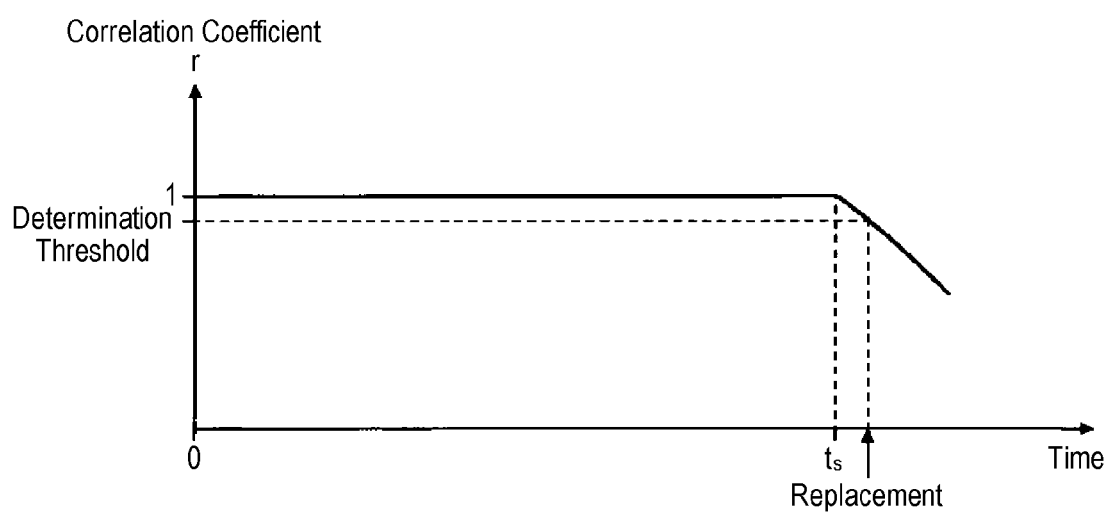
FIG. 10 is a view illustrating the exemplary time-dependent change of a transmission part used in a transport method according to a third embodiment.

Next, an example of the transport method according to the third embodiment will be described with reference to FIGS. 9 and 10. FIG. 9 is a view illustrating an exemplary transport method according to a second embodiment. FIG. 10 is a view illustrating the exemplary time-dependent change of a transmission part 70 used in a transport method according to a third embodiment.

As illustrated in FIG. 9, the controller 100 for controlling the transport method according to the third embodiment is different from the controller 100 for controlling the transport method according to the first embodiment illustrated in FIG. 4 in that the controller 100 for controlling the transport method according to the third embodiment further includes the function of a correlation determination part 160. The correlation determination part 160 determines a time-dependent change of the transmission part 70 based on a change in correlation between the rotation angle $\theta_{I3C}$ of the input shaft side encoder 69 and the rotation angle $\theta_{O3C}$ of the output shaft side encoder 79.

The horizontal axis in FIG. 10 represents the time during which the transmission part 70 is used, and the vertical axis represents, using a correlation coefficient r, the correlation between the rotation angle $\theta_{I3C}$ of the input shaft side encoder 69 and the rotation angle $\theta_{O3C}$ of the output shaft side encoder 79. The correlation coefficient r has a value in the range of −1 or more and 1 or less.

The correlation between the rotation angle θI3C of the input shaft side encoder 69 and the rotation angle $\theta_{O3C}$ of the output shaft side encoder 79 can be expressed by a proportional relationship (for example, a linear functional relationship). When the transmission part 70 is deteriorated due to wear or the like, the transmission condition of the transmission part 70 changes. Accordingly, the correlation function of the rotation angle $\theta_{O3C}$ on the output shaft side with respect to the rotation angle $\theta_{I3C}$ on the input shaft side is not a perfect linear function, but some variation occurs therein due to the deterioration of the transmission part 70.

In the example of FIG. 10, since the time-dependent change of the transmission part 70 hardly occurs until time $t_s$, the correlation coefficient r is approximately 1. On the other hand, after time $t_s$, variation in the proportional relationship of the rotation angle $\theta_{O3C}$ with respect to the rotation angle $\theta_{I3C}$ is likely to occur due to the time-dependent change in the transmission part 70, and the correlation coefficient r gently declines and becomes smaller than one.

In the present embodiment, the correlation determination part 160 inputs the rotation angle $\theta_{I3C}$ of the input shaft side encoder 69 and the rotation angle $\theta_{O3C}$ of the output shaft side encoder 79 so as to determine the time-dependent change of the transmission part 70 based on the change in correlation between the rotation angle $\theta_{I3C}$ and the rotation angle $\theta_{O3C}$. As an example, when the correlation function r indicating the change in correlation between the rotation angle $\theta_{I3C}$ and the rotation angle $\theta_{O3C}$ becomes equal to or less than a determination threshold, the correlation determination part 160 determines that the transmission part 70 needs to be replaced and performs display to prompt for replacement thereof. This display is an example of an alarm regarding the time-dependent change of the transmission part, and may prompt for maintenance, as another example. In addition, the alarm is not limited to display, and may be a voice, vibration, or the like. In addition, the determination threshold 106 is preset and stored in the memory 103 (see FIG. 5).

According to the third embodiment, based on a change in correlation between the rotation angle $\theta_{I3C}$ of the input shaft I and the rotation angle $\theta_{O3C}$ of the output shaft O, the time-dependent change of the transmission part 70 is determined, and a predetermined alarm is issued. Thereby, a gear or the like of the transmission part 70 may be replaced, and an overhaul or the like may be performed at an appropriate time. The correlation determination part 160 is included in the controller 100.

Although the transport apparatus 6, the semiconductor manufacturing apparatus 1, and the transport method of the transport apparatus 6 have been described in connection with the above embodiments, the present disclosure is not limited to the above embodiments, and various modifications and improvements can be made within the scope of the present disclosure. The matters described in the above-described plural embodiments may be combined as long as they do not contradict each other.

The processing modules 4 according to the present disclosure are applicable to any type of plasma among capacitively coupled plasma (CCP), inductively coupled plasma (ICP), plasma generated using a radial line slot antenna, electron cyclotron resonance plasma (ECR), or helicon wave plasma (HWP). In the present specification, a wafer W has been described as an example of a substrate. However, the substrate is not limited thereto, and may be any of various substrates used for a liquid crystal display (LCD), a flat panel display (FPD), a CD substrate, a printed circuit board, and the like.

According to an aspect, it is possible to enhance the accuracy of the tip position of the transport apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A transport apparatus comprising:
   an articulated arm including:
      a first arm in which a drive motor is installed;
      a second arm configured to be driven by the first arm;
      a transmission configured to convert a rotation of the drive motor into a rotation of the second arm via a joint;
      a first sensor configured to detect a first sensor value corresponding to a rotation angle of an input shaft of the transmission; and
      a second sensor configured to detect a second sensor value corresponding to a rotation angle of the second arm; and
   a controller configured to control the articulated arm,
   wherein the controller is further configured to control the second arm to a target rotation angle based on the first sensor value and the second sensor value, and
   wherein the controller is further configured to:
      calculate a deviation of the input shaft of the transmission, a differential value of the deviation of the input shaft, and an integral value of the deviation of the input shaft using the first sensor value, and control the second arm to the target rotation angle based on the calculated deviation of the input shaft, the differential value of the deviation of the input shaft, and the integral value of the deviation of the input shaft;

perform switching from the first sensor value to the second sensor value depending on a predetermined switching threshold; and calculate, after the performing switching, a deviation of the rotation angle of the second arm, a differential value of the deviation of the rotation angle of the second arm, and an integral value of the deviation of the rotation angle of the second arm using the second sensor value, and control the second arm to the target rotation angle based on the calculated deviation of the rotation angle of the second arm, the differential value of the deviation of the rotation angle of the second arm, and the integral value of the deviation of the rotation angle of the second arm.

2. The transport apparatus of claim 1, wherein the predetermined switching threshold is a rotation speed of the input shaft which is set previously, and the controller is further configured to perform switching from the first sensor value to the second sensor value when the differential value of the deviation of the input shaft calculated using the first sensor value exceeds a peak and then becomes equal to or lower than the predetermined switching threshold.

3. The transport apparatus of claim 1, wherein the predetermined switching threshold is a preset time, and the controller further is configured to perform switching from the first sensor value to the second sensor value when the preset time as the predetermined switching threshold elapses.

4. The transport apparatus of claim 1, wherein the predetermined switching threshold is a preset rotation angle of the input shaft, and the controller further is configured to perform switching from the first sensor value to the second sensor value when the first sensor value has approached the predetermined switching threshold.

5. The transport apparatus of claim 1, wherein the controller is further configured to determine a time-dependent change state of the transmission based on a change in correlation between the first sensor value and the second sensor value.

6. The transport apparatus of claim 5, wherein the controller is further configured to display an alarm concerning a time-dependent change of the transmission when the change in correlation between the first sensor value and the second sensor value is equal to or less than a predetermined determination threshold.

7. The transport apparatus of claim 1, wherein the articulated arm further includes:

a third arm configured to be driven by the second arm;

an additional transmission installed in the second arm, and configured to convert a rotation of a drive motor installed in the second arm into a rotation of the third arm via a joint;

a third sensor installed in the second arm and configured to detect a third sensor value corresponding to a rotation angle of an input shaft of the additional transmission of the second arm; and a fourth sensor installed in the third arm and configured to detect a fourth sensor value corresponding to a rotation angle of the third arm, and wherein the controller is further configured to control the third arm to a target rotation angle based on the third sensor value and the fourth sensor value.

8. A semiconductor manufacturing apparatus comprising:

a transport apparatus having an articulated arm and a controller configured to control the articulated arm; and a process module configured to process a substrate transported by the transport apparatus, wherein the articulated arm includes:

a first arm in which a drive motor is installed;

a second arm configured to be driven by the first arm;

a transmission configured to convert a rotation of the drive motor into a rotation of the second arm via a joint;

a first sensor configured to detect a first sensor value corresponding to a rotation angle of an input shaft of the transmission; and a second sensor configured to detect a second sensor value corresponding to a rotation angle of the second arm, and wherein the controller is further configured to control the second arm to a target rotation angle based on the first sensor value and the second sensor value, and wherein the controller is further configured to:

calculate a deviation of the input shaft of the transmission, a differential value of the deviation of the input shaft, and an integral value of the deviation of the input shaft using the first sensor value, and control the second arm to the target rotation angle based on the calculated deviation of the input shaft, the differential value of the deviation of the input shaft, and the integral value of the deviation of the input shaft;

perform switching from the first sensor value to the second sensor value depending on a predetermined switching threshold; and calculate, after the performing switching, a deviation of the rotation angle of the second arm, a differential value of the deviation of the rotation angle of the second arm, and an integral value of the deviation of the rotation angle of the second arm using the second sensor value, and control the second arm to the target rotation angle based on the calculated deviation of the rotation angle of the second arm, the differential value of the deviation of the rotation angle of the second arm, and the integral value of the deviation of the rotation angle of the second arm.

9. A transport method of controlling an articulated arm included in a transport apparatus, wherein the articulated arm includes: a first arm in which a drive motor is installed; a second arm configured to be driven by the first arm; a transmission configured to convert a rotation of the drive motor into a rotation of the second arm via a joint; a first sensor configured to detect a first sensor value corresponding to a rotation angle of an input shaft of the transmission; and a second sensor configured to detect a second sensor value corresponding to a rotation angle of the second arm, the transport method comprising:

controlling the second arm to a target rotation angle based on the first sensor value and the second sensor value by performing processes of:

calculating a deviation of the input shaft of the transmission, a differential value of the deviation of the input shaft, and an integral value of the deviation of the input shaft using the first sensor value, and controlling the second arm to the target rotation angle based on the calculated deviation of the input shaft, the differential value of the deviation of the input shaft, and the integral value of the deviation of the input shaft;

performing switching from the first sensor value to the second sensor value depending on a predetermined switching threshold; and calculating, after the performing switching, a deviation of the rotation angle of the second arm, a differential value of the deviation of the rotation angle of the second arm, and an integral value of the deviation of the rotation angle of the second arm using the second sensor value, and controlling the second arm to the target rotation angle based on the calculated deviation of the rotation angle of the second arm, the differential value of the deviation of the rotation angle of the second arm, and the integral value of the deviation of the rotation angle of the second arm.

* * * * *